(12) United States Patent
Sakai et al.

(10) Patent No.: US 7,678,589 B2
(45) Date of Patent: Mar. 16, 2010

(54) SEMICONDUCTOR DEVICE FOR PROVIDING CAPACITIVE SEMICONDUCTOR SENSOR AND METHOD FOR MANUFACTURING CAPACITIVE SEMICONDUCTOR SENSOR

(75) Inventors: Minekazu Sakai, Kariya (JP); Tameharu Oota, Takahama (JP)

(73) Assignee: DENSO CORPORATION, Kariya (JP)

( * ) Notice: Subject to any disclaimer, the term of this patent is extended or adjusted under 35 U.S.C. 154(b) by 405 days.

(21) Appl. No.: 11/723,428

(22) Filed: Mar. 20, 2007

(65) Prior Publication Data
US 2007/0289384 A1    Dec. 20, 2007

(30) Foreign Application Priority Data
Jun. 20, 2006    (JP)    ............... 2006-170125

(51) Int. Cl.
H01L 21/66    (2006.01)

(52) U.S. Cl. .................. 438/15; 438/113; 438/460; 257/E21.521; 257/E21.522; 257/E21.529; 257/777

(58) Field of Classification Search .............. 438/15, 438/113, 460, 612, 613; 257/737, 738, E21.521, 257/E21.522, E21.523, E21.529, 777
See application file for complete search history.

(56) References Cited

U.S. PATENT DOCUMENTS

| | | | |
|---|---|---|---|
| 5,362,681 A | 11/1994 | Roberts, Jr. et al. | |
| 5,786,979 A * | 7/1998 | Douglass | 361/328 |
| 5,856,914 A * | 1/1999 | O'Boyle | 361/761 |
| 5,864,063 A * | 1/1999 | Otani et al. | 73/514.32 |
| 6,349,240 B2 | 2/2002 | Ogawa et al. | |
| 6,812,690 B2 * | 11/2004 | De Jong et al. | 324/158.1 |
| 6,914,259 B2 * | 7/2005 | Sakiyama et al. | 257/48 |
| 7,054,705 B2 | 5/2006 | Ogawa et al. | |
| 7,294,927 B2 * | 11/2007 | Takahashi | 257/724 |
| 7,334,476 B2 * | 2/2008 | Ichikawa | 73/514.33 |
| 7,571,647 B2 * | 8/2009 | Takemasa et al. | 73/493 |
| 2002/0059010 A1 | 5/2002 | Ogawa et al. | |
| 2002/0153876 A1 * | 10/2002 | De Jong et al. | 324/158.1 |
| 2004/0173913 A1 | 9/2004 | Ohta | |
| 2005/0205951 A1 * | 9/2005 | Eskridge | 257/416 |
| 2006/0023109 A1 * | 2/2006 | Mabuchi et al. | 348/340 |
| 2006/0086186 A1 * | 4/2006 | Ichikawa | 73/514.36 |
| 2006/0220260 A1 * | 10/2006 | Takahashi | 257/778 |

(Continued)

FOREIGN PATENT DOCUMENTS

JP    A-2000-321300    4/2000

(Continued)

Primary Examiner—M. Wilczewski
(74) Attorney, Agent, or Firm—Posz Law Group, PLC

(57) ABSTRACT

A method for manufacturing a capacitive semiconductor sensor includes: forming a plurality of circuit chips in a wafer, wherein each circuit chip includes a pad for testing a sensor chip; bonding the sensor chip on each circuit chip with a bump so that the sensor chip is electrically coupled with the circuit chip, wherein each sensor chip is made of semiconductor and has a capacitance changing portion, which is disposed on one side of the sensor chip and has a variable capacitance, wherein the circuit chip detects a capacitance change of the sensor chip, and wherein the one side of the sensor chip faces the circuit chip; testing each sensor chip through the pad; and cutting the wafer into individual circuit chips so that the circuit chip and the sensor chip provide the capacitive semiconductor sensor.

12 Claims, 5 Drawing Sheets

U.S. PATENT DOCUMENTS

| | | | |
|---|---|---|---|
| 2007/0044557 A1* | 3/2007 | Takemasa et al. | 73/493 |
| 2008/0012148 A1* | 1/2008 | Takahashi | 257/778 |
| 2008/0034868 A1* | 2/2008 | Nakatani et al. | 73/514.33 |
| 2008/0131989 A1* | 6/2008 | Ichikawa | 438/51 |
| 2008/0250859 A1* | 10/2008 | Nakatani | 73/488 |
| 2009/0014762 A1* | 1/2009 | Matsuo et al. | 257/292 |
| 2009/0085217 A1* | 4/2009 | Knickerbocker et al. | 257/774 |

FOREIGN PATENT DOCUMENTS

| | | |
|---|---|---|
| JP | A-2001-217280 | 8/2001 |

* cited by examiner

US 7,678,589 B2

SEMICONDUCTOR DEVICE FOR PROVIDING CAPACITIVE SEMICONDUCTOR SENSOR AND METHOD FOR MANUFACTURING CAPACITIVE SEMICONDUCTOR SENSOR

CROSS REFERENCE TO RELATED APPLICATION

This application is based on Japanese Patent Application No. 2006-170125 filed on Jun. 20, 2006, the disclosure of which is incorporated herein by reference.

FIELD OF THE INVENTION

The present invention relates to a semiconductor device for providing a capacitive semiconductor sensor and a method for manufacturing a capacitive semiconductor sensor.

BACKGROUND OF THE INVENTION

Conventionally, as this sort of semiconductor capacitance type sensor, for example, semiconductor mechanical amount sensors such as acceleration sensors and angular velocity sensors have been proposed (in, for example, JP-A-2004-271312 corresponding to US Patent Application Publication No. 2004-0173913). These semiconductor capacitance type sensors correspond to such sensors equipped with sensor chips having movable electrodes and fixed electrodes and functioning as capacitance changing portions. Then, when mechanical amounts such as acceleration and angular velocities are applied to such sensor chips, distances between the movable electrodes and the fixed electrodes are changed, so that capacitance changes may be conducted.

Then, while these sensor chips are assembled with circuit chips, the capacitance changes of these sensor chips are converted into voltage changes, namely, voltage signals by CV converting circuits (namely, capacitance-to-voltage converting circuits) provided in the circuit chips. Thereafter, the voltage signals are outputted as sensor signals, so that the applied mechanical amounts are measured.

Such semiconductor capacitance type sensors have been manufactured as follows: That is, while sensor chips and circuit chips are manufactured respectively by performing semiconductor process operations, characteristics of the sensor chips are tested under condition of a single sensor chip, and thereafter, such sensor chips which are judged as good products are assembled with the circuit chips, and thus, these sensor chips and circuit chips are electrically connected to each other.

In general, characteristic testing operations as to sensor chips are carried out in such a way that capacitance changes in capacitance changing portions are checked by employing such testers as an LCR meter. While probes of the testers are attached to pads of the sensor chips, capacitances of the capacitance changing portions are converted into voltages within the testers under this condition in order to test the sensor characteristics.

Also, as methods for measuring capacitances of semiconductor capacitance type sensors other than the above-described capacitance measuring methods, conventionally, another method for measuring capacitance values has been proposed (in JP-A-2000-321300). That is, in this capacitance value measuring method, while a plurality of sensor chips are employed, capacitance values of these sensor chips are measured, and asymptotes are calculated which represent a relationship between the measured capacitance values and distances defined between the capacitances and the electrodes, so that the capacitance values are acquired.

In the above-described method for testing the sensor characteristics under the single sensor chip condition by utilizing the tester, stray capacitances produced at the probe portion of the tester which are attached to the pads provided in the sensor chip and stray capacitances of these pads are large, for example, approximately 1 pF to 100 pF, with respect to very small capacitance values (for example, approximately 1 pF) of the capacitance changing portions.

As a result, the conventional characteristic testing methods have the following problems. That is, errors contained in the capacitance values acquired by the testing operations become large with respect to the capacitance values of the sensor chips under such a condition that these sensor chips are electrically connected to the circuit chips, namely under packaging condition of the sensor chips, so that the high-precision capacitance value measuring operations can be hardly carried out.

Also, in the measuring method, although the capacitance values are predicted by employing the asymptotes, the adverse influence caused by the stray capacitance can be hardly avoided. Thus, there are some possibilities that the errors contained in the capacitance values measured by this method become larger with respect to the capacitance values under the packaging condition.

Also, another characteristic testing method may be conceived. That is, sensor chips are assembled with circuit chips, which are cut out from a wafer, so as to be brought into packaging members. Thereafter, a characteristic as to each of these packaging members under packaging condition may be tested. However, in this conceivable method, a large number of these packaging members must be picked up one by one, and these picked packaging members must be separately mounted on a testing apparatus, resulting in cumbersome handling operations.

Furthermore, another testing method may be conceived. That is, a wafer where structural members which constitute sensor chips have been formed is employed before the sensor chips are cut out, and then, an electric testing operation is carried out under present condition of this wafer. However, in this conceivable method, since probes of a tester are attached to pads of the wafer, materials of these pads are scooped out. Thus, there are some risks that the scooped materials are adhered as alien substances to capacitance changing portions.

Therefore, it is required to provide a packaging condition with a superior handling characteristic when a characteristic testing operation is carried out, and furthermore, while avoiding that alien substances are adhered onto the capacitance changing portions, the characteristic testing operations of the sensor chips can be carried out.

SUMMARY OF THE INVENTION

In view of the above-described problem, it is an object of the present disclosure to provide a semiconductor device for providing a capacitive semiconductor sensor. It is another object of the present disclosure to provide a method for manufacturing a capacitive semiconductor sensor.

According to a first aspect of the present disclosure, a method for manufacturing a capacitive semiconductor sensor includes: forming a plurality of circuit chips in a wafer, wherein each circuit chip includes a pad for testing a sensor chip; bonding the sensor chip on each circuit chip with a bump so that the sensor chip is electrically coupled with the circuit chip, wherein each sensor chip is made of semiconductor and has a capacitance changing portion, which is disposed on one side of the sensor chip and has a variable capacitance, wherein the circuit chip detects a capacitance change of the sensor chip, and wherein the one side of the sensor chip faces the circuit chip; testing each sensor chip through the pad; and cutting the wafer into individual circuit chips so that the circuit chip and the sensor chip provide the capacitive semiconductor sensor.

In the above method, the sensor chips are integrally formed on the wafer. Thus, handling of the capacitive semiconductor sensor is improved. Further, since the capacitance changing portion is disposed on the one side of the sensor chip facing the circuit chip, a foreign particle is perverted from penetrating into the capacitance changing portion. Accordingly, testing of the sensor chip is appropriately performed with easy handling and without the foreign particle in the capacitance changing portion According to a second aspect of the present disclosure, a method for manufacturing a capacitive semiconductor sensor includes: forming a plurality of circuit chips in a wafer, wherein each circuit chip includes a pad for testing a sensor chip; bonding the wafer on a first dicing tape; cutting the wafer into individual circuit chips; bonding the sensor chip on each circuit chip with a bump so that the sensor chip is electrically coupled with the circuit chip, wherein each sensor chip is made of semiconductor and has a capacitance changing portion, which is disposed on one side of the sensor chip and has a variable capacitance, wherein the circuit chip detects a capacitance change of the sensor chip, and wherein the one side of the sensor chip faces the circuit chip; testing each sensor chip through the pad; and removing the first dicing tape from the circuit chips after the bonding so that the circuit chip and the sensor chip provide the capacitive semiconductor sensor.

In the above method, the circuit chips are integrally bonded to the dicing tape. Thus, handling of the capacitive semiconductor sensor is improved. Further, since the capacitance changing portion is disposed on the one side of the sensor chip facing the circuit chip, a foreign particle is perverted from penetrating into the capacitance changing portion. Accordingly, testing of the sensor chip is appropriately performed with easy handling and without the foreign particle in the capacitance changing portion According to a third aspect of the present disclosure, a semiconductor device for providing a capacitive semiconductor sensor includes: a semiconductor wafer; a plurality of circuit chips in the wafer, wherein each circuit chip includes a pad for testing a sensor chip; and a plurality of sensor chips, each of which is disposed on the circuit chip with a bump so that the sensor chip is electrically coupled with the circuit chip. Each sensor chip is made of semiconductor and has a capacitance changing portion, which is disposed on one side of the sensor chip and has a variable capacitance. The one side of the sensor chip faces the circuit chip. The circuit chip detects a capacitance change of the sensor chip. The wafer is capable of being cut into individual circuit chips so that the circuit chip and the sensor chip provide the capacitive semiconductor sensor.

The above semiconductor device provides to test the sensor chip appropriately with easy handling and without the foreign particle in the capacitance changing portion

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1A:
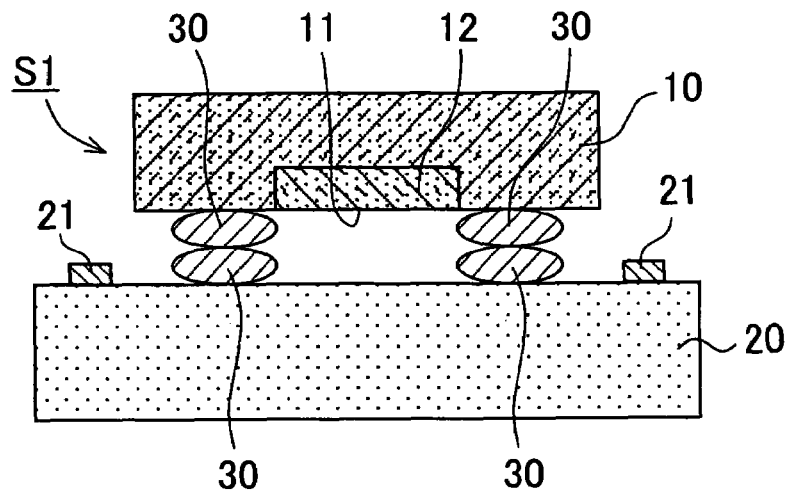
FIG. 1A is a cross sectional view showing a capacitive semiconductor sensor taken along line IA-IA in FIG. 1B.
Figure 1B:
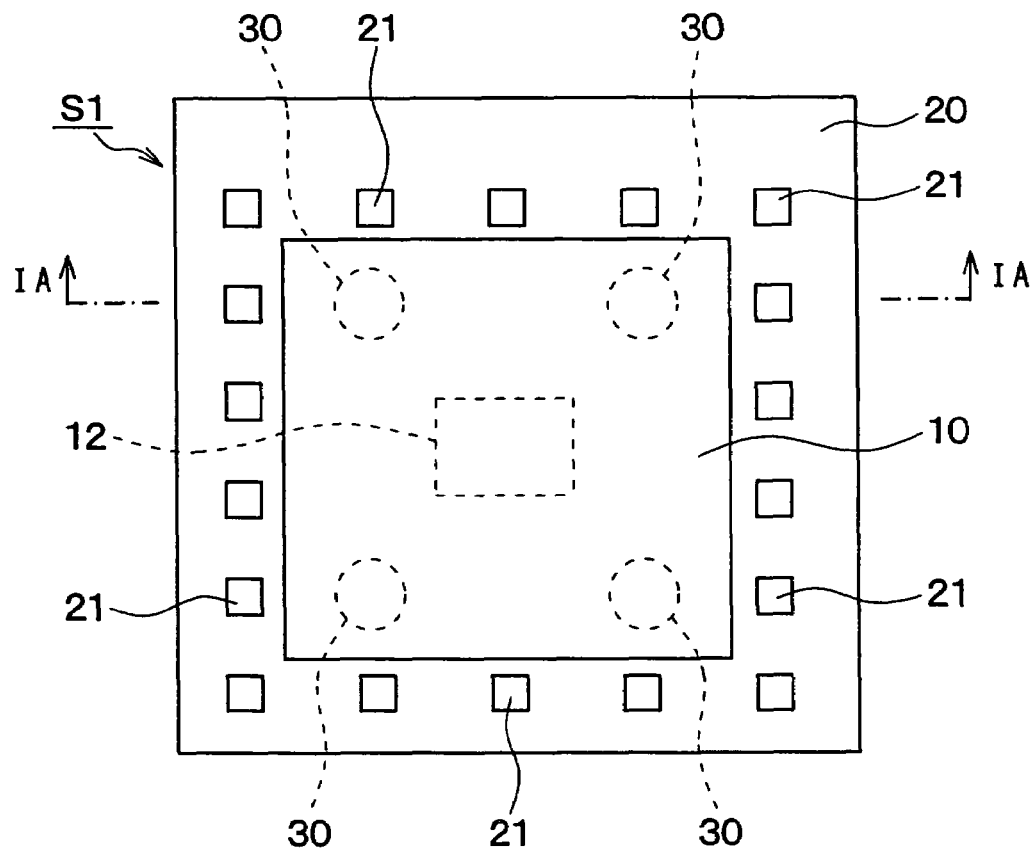
FIG. 1B is a plan view showing the sensor according to a first embodiment.

FIG. 1 is a diagram for indicating a structure of a semiconductor capacitance type acceleration sensor S1 functioning as a semiconductor capacitance type sensor according to a first embodiment, concretely speaking, FIG. 1A is a sectional view for schematically indicating the semiconductor capacitance type acceleration sensor S1; and FIG. 1B is a plan view for schematically indicating the acceleration sensor S1 as viewed along a top direction of FIG. 1A. FIG. 1A indicates the sectional view taken along a line IA to IA of FIG. 1B. Although applicability of the above-described acceleration sensor S1 is not specifically limited to a specific field, this acceleration sensor S1 may be applied to, for example, automobile-purpose acceleration sensors capable of actuating and controlling air bags, ABS, VSC, and the like.

A sensor chip 10 is made of a semiconductor chip such as a silicon semiconductor, and has a capacitance changing portion 12 on the side of one plane 11 thereof. As to the capacitance changing portion 12, any types of capacitance changing portions whose capacitances are changed by applying thereto acceleration may be alternatively employed. For instance, such a capacitance changing portion having a comb-shaped variable electrode and a fixed electrode may be employed.

Although not shown, in the case of the capacitance changing portion 12 having such a movable electrode and a fixed electrode, when acceleration is applied thereto, the movable electrode is displaced along a predetermined direction. As a result, a distance between the movable electrode and the fixed electrode is changed, and a capacitance between both the electrodes is also changed. Then, since this capacitance change is detected, the applied acceleration is measured.

Although there is no specifically limitation, such a sensor chip 10 may be constructed as follows: That is, for instance, an SOI (Silicon-on-Insulator) substrate manufactured by joining a first silicon substrate via an oxide film to a second silicon substrate is processed by employing a micromachining technique, and the like. Also, while a pad (not shown)

made of aluminum or the like has been provided on one plane 11 of the sensor chip 10, this pad has been electrically connected to the capacitance changing portion 12.

Then, the sensor chip 10 has been mounted on a circuit chip 20 under such a condition that one plane 11 thereof is located opposite to the circuit chip 20. The circuit chip 20 is made of a semiconductor chip such as a silicon semiconductor, and has a function capable of converting a capacitance change of the capacitance changing portion 12 in the sensor chip 10 into a voltage signal.

Specifically, this function may be realized by providing a CV converting circuit in the circuit chip 20. It should be understood that similar to a general-purpose CV converting circuit, the above-described CV converting circuit may be constructed by manufacturing MOS transistor elements and the like with respect to the silicon semiconductor chip functioning as the circuit chip 20 by using a semiconductor process.

Then, the sensor chip 10 has been electrically and mechanically joined to the circuit chip 20 via bumps 30. In this case, the bumps 30 have been provided on the side of the sensor chip 10 and on the side of the circuit chip 20 respectively under such a condition that tip portions of these bumps 30 on both sides join to each other.

The bumps 30 have been provided at positions corresponding to the pads (not shown) on one plane 11 of the sensor chip 10, whereas the bumps 30 have been provided at positions corresponding to the electrodes (not shown) of the circuit chip 20, so that these pads are electrically connected via the bump 30 to the electrodes.

As such bumps 30, these bumps 30 may be formed by employing general bump materials such as gold, copper, and aluminum in accordance with known methods, for example, a plating method, and a vapor deposition method. Then, the bumps 30 provided on the side of the sensor chip 10 have been connected to the bumps 30 provided on the side of the circuit chip 20 by using a general connecting method such as a thermal crimping method. Also, as the bumps 30 of the first embodiment, while solder bumps may be employed, these solder bumps may be joined to each other by a soldering joint.

Alternatively, the bumps 30 may be provided only on one chip selected from the sensor chip 10 and the circuit chip 20, so that both the sensor chip 10 and the circuit chip 20 may be joined to each other by the above-described bumps 30. In this alternative case, known methods may be employed as to the forming method and the connecting method of these bumps 30.

Also, testing-purpose pads 21 have been provided at a peripheral portion of the plane in the circuit chip 20, on which the sensor chip 10 is mounted. These testing-purpose pads 21 are employed in characteristic testing steps in the below-mentioned manufacturing method. These testing-purpose pads 21 are made of aluminum, and the like, and have been electrically connected via the bumps 30 to the capacitance changing portion 12 of the sensor chip 10.

As previously described, in the acceleration sensor S1 of the first embodiment, the sensor chip 10 made of the semiconductor and having the capacitance changing portion 12 on the side of one plane 11 has been electrically connected via the bumps 30 to the circuit chip 20 in such a manner that one plane 11 of the sensor chip 10 is directed to the circuit chip 20.

Then, in the acceleration sensor S1, when the capacitance of the capacitance changing portion 12 in the sensor chip 10 is changed by applying thereto acceleration, this capacitance change is converted by the circuit chip 20 into a voltage signal. Thereafter, since the voltage signal is outputted outside this acceleration sensor S1 as a sensor signal, the applied acceleration may be detected by this acceleration sensor S1.

Figure 2A:
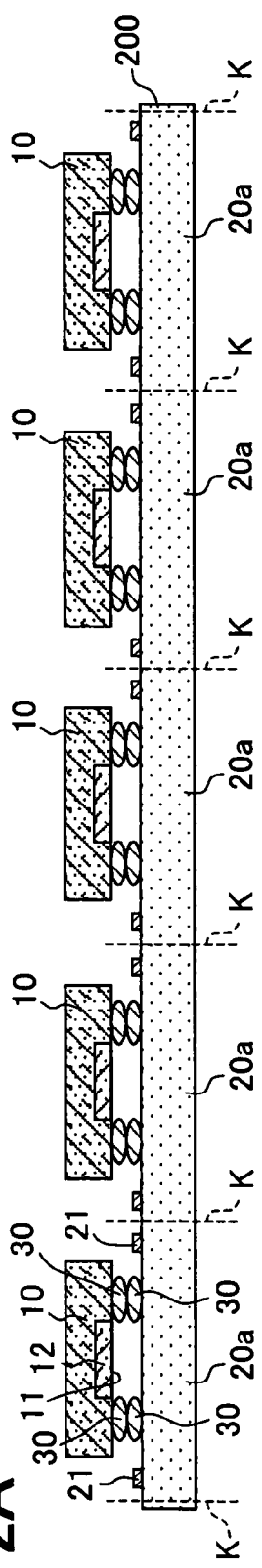
FIG. 2A is a cross sectional view showing a wafer taken along line IIA-IIA in FIG. 2B.
Figure 2B:
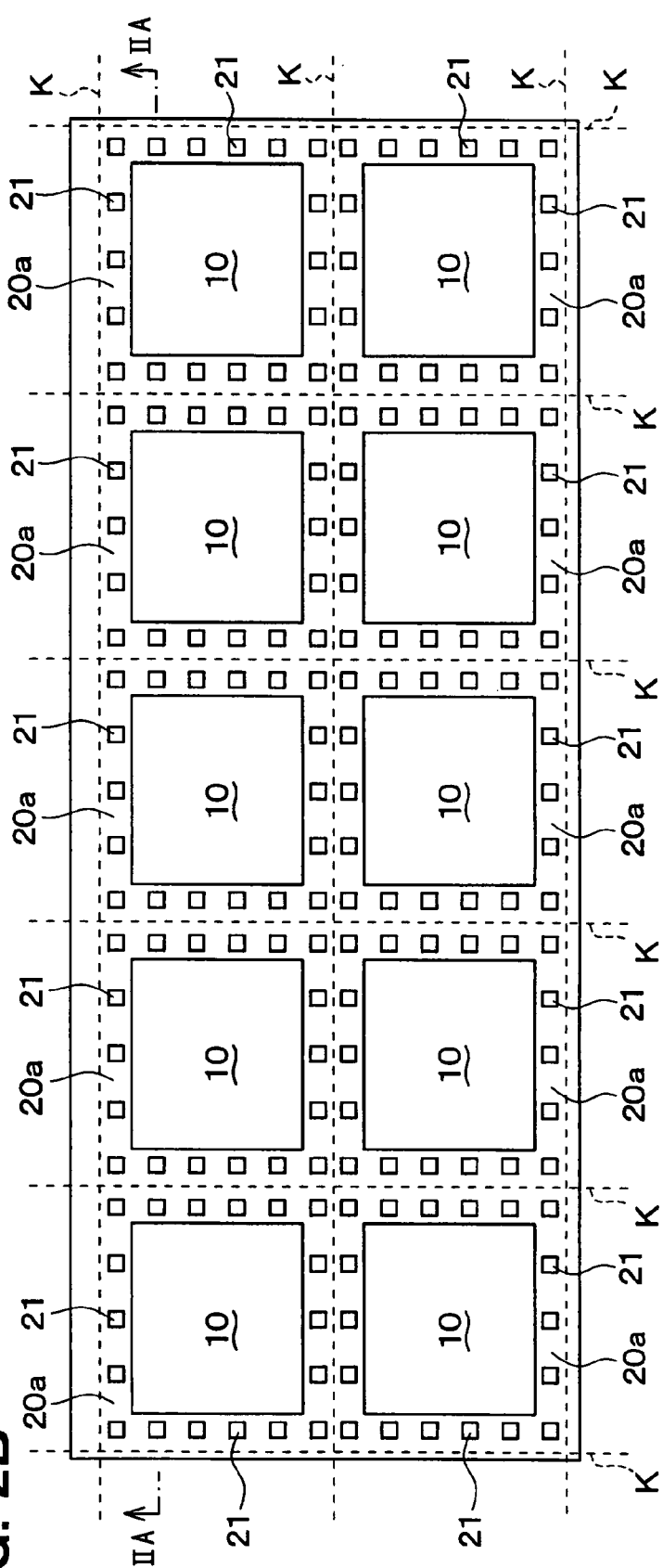
FIG. 2B is a plan view explaining a method for manufacturing the sensor from the wafer according to the first embodiment.

Next, a method for manufacturing the above-described acceleration sensor S1 will now be described with reference to FIGS. 2A and 2B. FIG. 2 shows a step diagram for indicating the manufacturing method of the acceleration sensor S1 according to the first embodiment, namely, FIG. 2A is a sectional view for schematically showing the acceleration sensor S1; and FIG. 2B is a plan view for schematically showing the sensor S1 as viewed along an upper direction of FIG. 2A.

As previously described, firstly, as to the sensor chip 10, sensor chips are manufactured from a semiconductor wafer by employing the micromachining technique, and the like. A circuit wafer 200 is prepared on which a plurality of structural members 20a have been formed. These structural members 20a constitute the above-described circuit chips 20. In this case, the structural members 20a have been sectioned by employing scribe lines "K" indicated by broken lines in FIG. 2A and FIG. 2B, and correspond to the circuit chips 20 before being cut out.

Also, in the circuit wafer 200, the above-described testing-purpose pads 21 have been provided with respect to the respective structural members 20a. Similar to FIG. 1A and FIG. 1B, the testing-purpose pads 21 have been provided at peripheral portions of these structural members 20a. Such a circuit wafer 200 is manufactured in such a manner that the structural members 20a and the testing-purpose pads 21 are formed with respect to a silicon semiconductor wafer, or the like by employing a semiconductor process.

With respect to the circuit wafer 200 prepared in the above-explained manner, a sensor chip 10 is mounted on each of the structural members 20a. In other words, while one plane 11 of this sensor chip 10 is located opposite to a structural member 20a in the circuit wafer 200, the sensor chips 10 are mounted via bumps 30 on the respective structural members 20a. Then, the bumps 30 are electrically and mechanically joined to each other by employing such a joining method as an ultrasonic joining manner.

The conditions of the circuit wafer 200 manufactured up to the present step are represented in FIG. 2A and FIG. 2B. As a result, the sensor chips 10 are electrically connected to the structural members 20a, and although the circuit chips 20 have not yet been accomplished as circuit chips, these conditions essentially constitute packaging conditions thereof. Then, under this condition, characteristics of the respective sensor chips 10 are tested via the testing-purpose pads 21. In this stage, while a tester (not shown) is employed which is used in the conventional characteristic test, probes of this tester are contacted to the testing-purpose pads 21 so as to perform electric testing operations.

In such a case where a capacitance changing portion 12 is such a portion having the above-explained movable electrode and fixed electrode, electrostatic force is applied between the movable electrode and the fixed electrode from the testing-purpose pads 21 by the tester in order to change a capacitance between the movable electrode and the fixed electrode.

Then, this capacitance change is C/V-converted by the structural member 20a in the circuit wafer 200 so as to be converted to a voltage signal. It should be understood that as previously described in FIG. 1A and FIG. 1B, since the circuit chip 20 has the CV converting function, the structural member 20a apparently has the same function.

Then, this voltage change is outputted from the testing-purpose pad 21 to the tester. In other words, in this first embodiment, while the electric characteristics are tested under essentially product conditions, the capacitance signals of the sensor chips 10 are CV-converted not by the tester, but by the structural members 20a which constitute the circuit chips 20 into the voltage signals, which are similarly carried out in products. As a consequence, in the tester, the converted voltage signals may be merely tested, so that the above-described stray capacitance problem can be avoided.

In the above-described manufacturing method, the characteristic check which is fitted to the packaging condition is carried out with respect to a set sensor chip made of each of the sensor chips 10 and each of the structural members 20a. Then, if such a set sensor chip can satisfy the sensor characteristic specification, then this set sensor chip may be judged as a good product, whereas if such a set sensor chip cannot satisfy the sensor characteristic specification, then this set sensor chip may be judged as a failure product. Thereafter, a dicing cut is carried out along the scribe lines "K" in order to segment the circuit wafer 200 in the unit of the structural member 20a, namely in the unit of a chip. As a result, the acceleration sensor S1 of this first embodiment can be manufactured.

On the other hand, in accordance with the manufacturing method of the first embodiment, since the sensor chips 10 are electrically joined via the bumps 30 to the structural members 20a which constitute the circuit chips 20, the sensor chips 10 and the structural members 20a are brought into the essentially packaging condition, so that the characteristics can be tested under this essentially packaging condition. As a consequence, the CV conversions are carried out in the structural members 20a, and the above-described stray capacitance problem related to the tester can be avoided.

Also, the sensor chips 10 are formed in an integral manner by the circuit wafer 200, so that handling of these sensor chips 10 can be easily performed. Even under such a condition shown in FIG. 1A and FIG. 1B, although testing operations under packaging condition may be carried out, in this case, when these testing operations are carried out, a large number of acceleration sensors S1 formed in small chip shapes are handled. As a result, the chip handling characteristics of this case is deteriorated, as compared with that of the present manufacturing method.

Moreover, in the above-described manufacturing method, when the characteristic testing operations are carried out, the one planes 11 in the sensor chips 10, namely the planes 11 of the capacitance changing portions 12 are directed to the circuit wafer 200. As a consequence, for instance, since the probes of the tester are attached to the testing-purpose pads 21, the pads 21 are scooped out. As a result, even when an alien substance is produced, this alien substance can be hardly entered into spaces between the planes 11 of the capacitance changing portions 12 in the sensor chips 10 and the circuit wafers 200.

Then, in accordance with the manufacturing method of the first embodiment which has the above-explained merits, during the characteristic testing operations, the packaging conditions with the superior handing characteristics can be realized, and furthermore, the characteristics of the sensor chips 10 can be tested while avoiding that the alien substances are adhered to the capacitance changing portions 12.

Second Embodiment

Figure 3A:
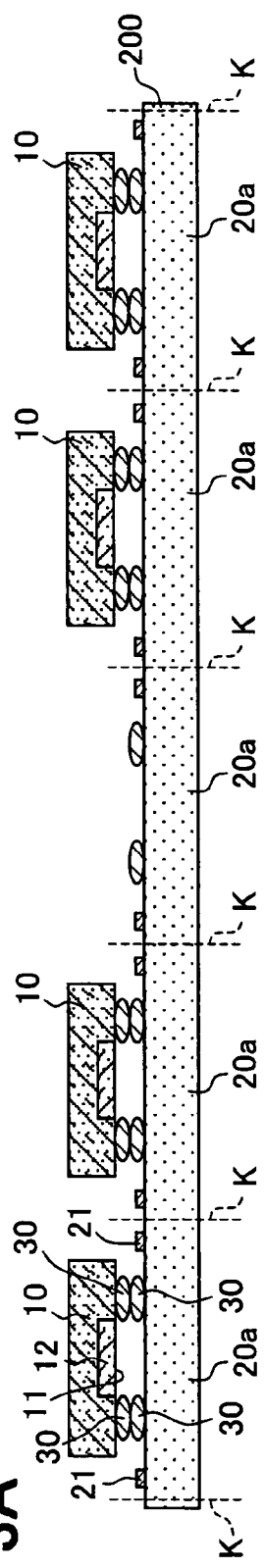
FIG. 3A is a cross sectional view showing a wafer taken along line IIIA-IIIA in FIG. 3B.
Figure 3B:
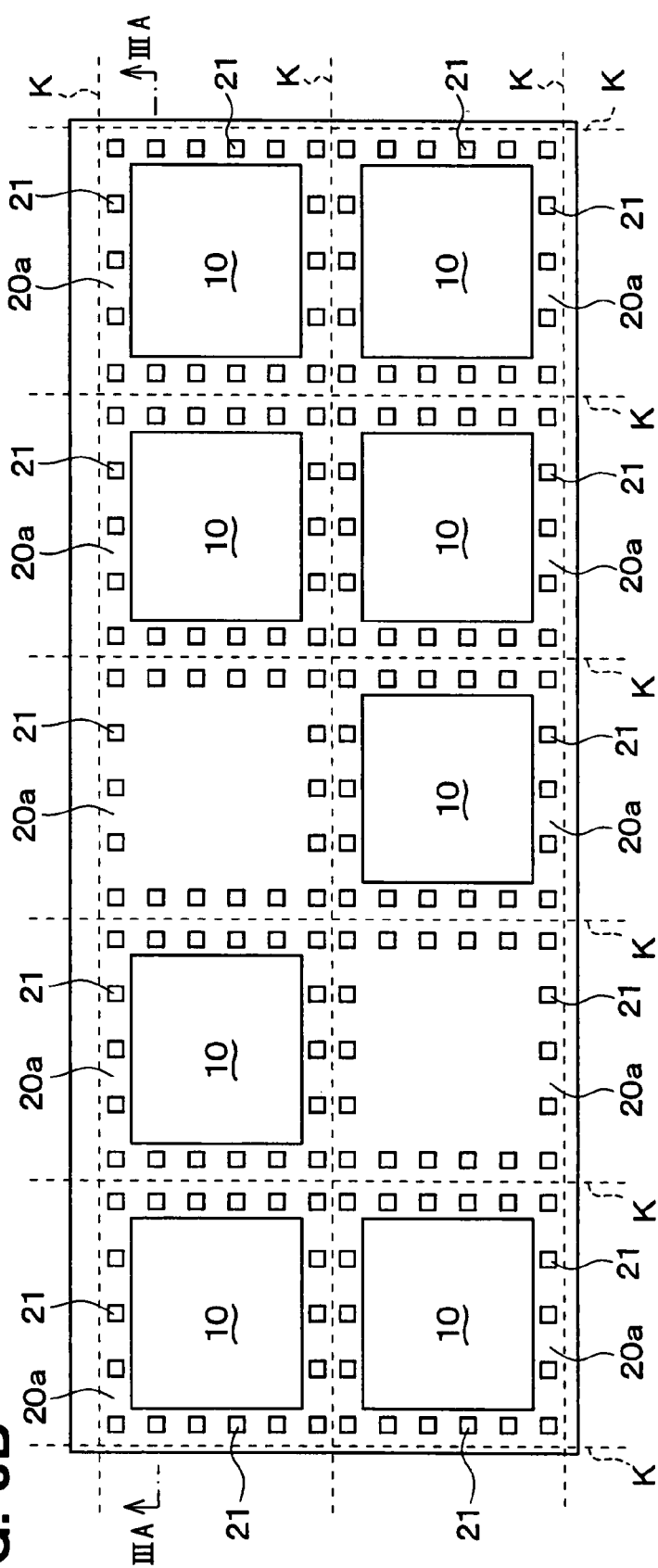
FIG. 3B is a plan view explaining a method for manufacturing a capacitive semiconductor sensor from the wafer according to a second embodiment.

FIGS. 3A and 3B show a step diagram for indicating a manufacturing method of an acceleration sensor S1 according to a second embodiment, namely, FIG. 3A is a sectional view for schematically showing the acceleration sensor S1; and FIG. 3B is a plan view for schematically showing the acceleration sensor S1, as viewed along an upper direction of FIG. 3A.

In accordance with the manufacturing method of this second embodiment, in the above-described manufacturing method of the first embodiment, before the sensor chips 10 are joined via the bumps 30 to the circuit wafer 200, characteristics of the respective structural members 20a are tested in the circuit wafer 200. A characteristic of this structural member 20a can be tested via a testing-purpose pad 21 by employing the above-explained tester.

A sensor chip 10 is not joined on such a structural member 20a which is judged as a failure product by executing the above-explained testing operation of the structural member 20a. In FIG. 3, the sensor chip 10 is not mounted on this failure product. Thereafter, as to the sensor chips 10 mounted on the structural members 20a, characteristic testing operations similar to the above-described testing operation are carried out, and then, the circuit wafer 200 is segmented.

As previously described, also in this second embodiment, such an acceleration sensor S1 as indicated in FIG. 1A and FIG. 1B may be manufactured. In this second embodiment, in addition to the above-explained effects achieved by the manufacturing method of the first embodiment, the acceleration sensors S1 can be manufactured in a higher yield without wasting the sensor chips 10, so that the reduction of the manufacturing cost can be expected.

Third Embodiment

Figure 4:
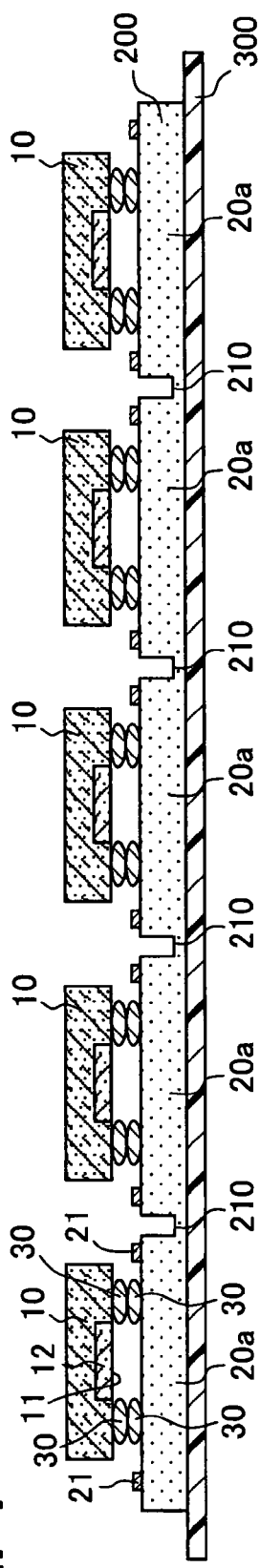
FIG. 4 is a cross sectional view explaining a method for manufacturing a capacitive semiconductor sensor from a wafer according to a third embodiment.

FIG. 4 is a step diagram for indicating a manufacturing method of an acceleration sensor S1 in a sectional view manner, according to a third embodiment.

In the manufacturing methods of the above-described respective embodiments, since the characteristic testing operations of the sensor chips 10 are carried out under the condition of the circuit wafer 200, the characteristic testing operations may be readily influenced by stresses which are produced by cambers of the circuit wafer 200, and the like.

As a consequence, in the manufacturing method of this third embodiment, in the above-described manufacturing method of the first embodiment, before the sensor chips 10 are joined via the bumps 30 to the circuit wafer 200, the circuit wafer 200 is half-cut in the unit of a structural member 20a. This half cutting operation may be carried out in such a manner that a dicing cut is performed along the above-described scribe line, and this dicing cut is stopped in a halfway along the thickness direction of the circuit wafer 200.

In this case, as shown in FIG. 4, a half-cutting operation is performed while a dicing-purpose dicing tape 300 is adhered onto such a plane of the circuit wafer 200, which should be half-cut, namely adhered onto a plane of the circuit wafer 200 which is located opposite to the joining plane of the sensor chip 10. Then, notches 210 are formed in the scribed area. Then, after the half-cutting operation has been carried out, the dicing tape 300 is still left on this plane for the sake of reinforcing of the circuit wafer 200. It should also be noted that this dicing tape 300 may be alternatively stripped from the circuit wafer 200 after the above-described half-cutting operation.

Then, the sensor chips 10 are joined via the bumps 30 under this condition. Thereafter, characteristic testing operations similar to those of the above-described embodiment are carried out, the half-cut portion within the circuit wafer 200 is completely segmented by the dicing cut, and then, the dicing tape 300 is striped. As previously described, also in this third embodiment, such an acceleration sensor S1 as indicated in FIG. 1A and FIG. 1B may be manufactured.

In the third embodiment, in addition to the above-explained effects achieved by the manufacturing method of the first embodiment, the stress generated by the cambers of the circuit wafer 200 can be relaxed by the half-cut portion, and also, the adverse influence given to the characteristic testing operation due to the stress can be reduced. It should also be understood that even in this third embodiment, similar to the above-explained second embodiment, the method by which the sensor chip 10 is not mounted on the structural member 20a which constitutes the failure product may be alternatively employed.

Fourth Embodiment

Figure 5A:
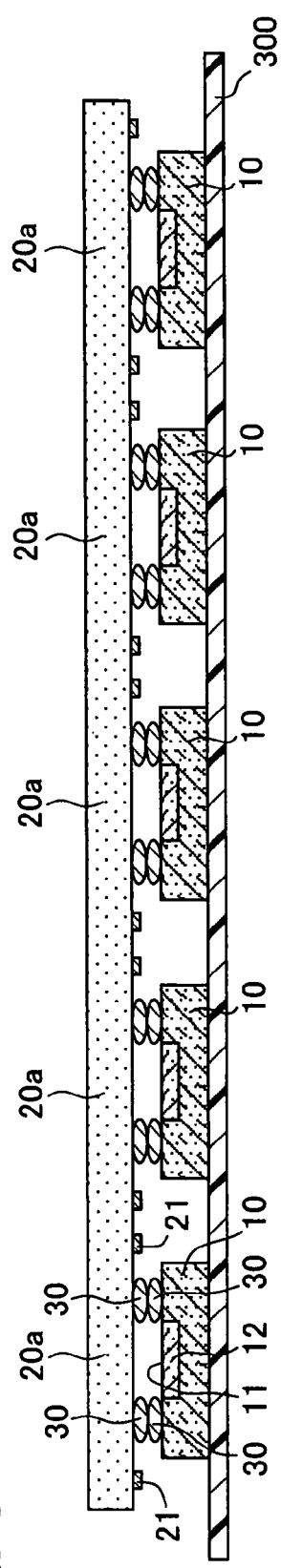
FIGS. 5A and 5B are cross sectional views explaining a method for manufacturing a capacitive semiconductor sensor from a wafer according to a fourth embodiment.
Figure 5B:
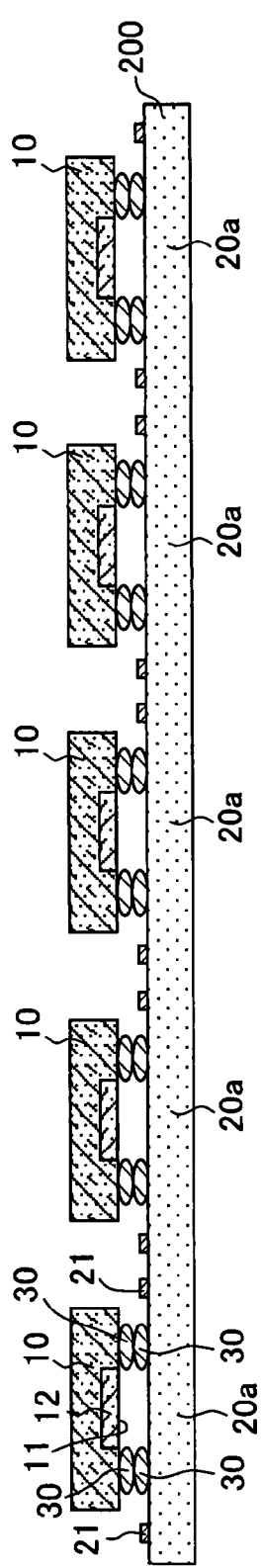

FIG. 5A and FIG. 5B are step diagrams for indicating a manufacturing method of an acceleration sensor S1 in a sectional view manner, according to a fourth embodiment. This fourth embodiment corresponds to such a method that in the above-described first embodiment, the method for mounting the sensor chips 10 on the circuit wafer 200 is modified.

That is, in the manufacturing method of this fourth embodiment, as indicated in FIG. 5A, a plurality of sensor chips 10 are arranged in correspondence with an arrangement of structural members 20a in a circuit wafer 200. Then, planes of these sensor chips 10 arranged in this manner are adhered to a tape material 300, while these planes are located opposite to the capacitance changing portions 12 of the respective sensor chips 10.

As previously explained, the respective sensor chips 10 are brought into such a condition that these sensor chips 10 are coupled to each other in one body by the tape material 300 under the same array status as the array status when these sensor chips 10 are mounted on the circuit wafer 200. In this case, as the tape material 300, the above-explained dicing-purpose dicing tape 300 is employed. Such a dicing tape 300 is made of a polyimide series resin. It should also be noted that in addition to these tapes, any other materials capable of being adhered to the sensor chip 10 may be employed as the tape material.

Next, in this fourth embodiment, the plurality of these sensor chips 10 formed in one body are joined onto the circuit wafer 200. In this case, as indicated in FIG. 5A, in the respective sensor chips 10 formed in one body, one planes 11 of these sensor chips 10 are directed upwardly; the circuit wafer 200 is mounted from the upper direction via the bumps 30; and then, these sensor chips 10 are joined via the bumps 30 onto the circuit wafer 200.

After the respective sensor chips 10 formed in one body have been electrically connected to the respective structural members 20a of the circuit wafer 200 in the above-described manner, the tape material 300 is stripped from the sensor chips 10. Then, as shown in FIG. 5B, the work is turned over, and thus, the sensor chips 10 are positioned upwardly.

The condition shown in FIG. 5B is similar to the condition indicated in FIG. 2A and FIG. 2B. Thereafter, as to the sensor chips 10, characteristic testing operations similar to those of the previous embodiments are carried out, and then, the circuit wafer 200 is segmented. As previously described, also in this fourth embodiment, such an acceleration sensor S1 as indicated in FIG. 1A and FIG. 1B may be manufactured.

This fourth embodiment may be applied not only to the above-described first embodiment, but also to the second and third embodiments. For example, when this fourth embodiment is applied to the second embodiment, the sensor chip 10 is not adhered to the tape material 300 at such a portion corresponding to a structural member 20a of a failure product.

Then, in accordance with this fourth embodiment, in addition to the effects achieved by the manufacturing methods of the first to third embodiments, the plurality of sensor chips 10 are formed in one body by the tape material 300 and these sensor chips formed in one body are mounted on the circuit wafer 200. As a result, plural pieces of these sensor chips 10 can be mounted on the circuit wafer 200 in a batch manner.

Fifth Embodiment

Figure 6:
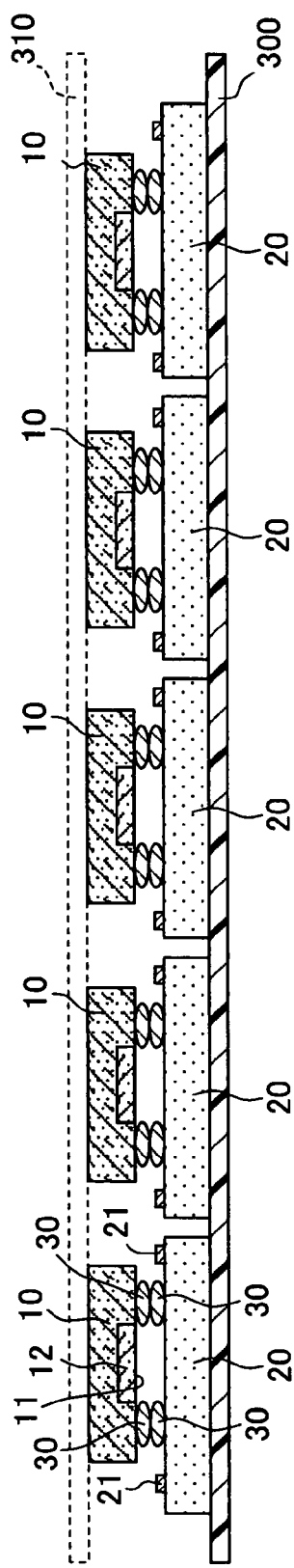
FIG. 6 is a cross sectional view explaining a method for manufacturing a capacitive semiconductor sensor from a wafer according to a fifth embodiment.

FIG. 6 is a step diagram for indicating a manufacturing method of an acceleration sensor S1 in a sectional view manner, according to a fifth embodiment. In the above-described respective embodiments, the sensor chips 10 are mounted on the circuit wafer 200, and thereafter, are joined to the circuit wafer 200. In this fifth embodiment, a circuit wafer 200 is segmented so as to obtain wafer chips, and thereafter, sensor chips 10 are mounted on these wafer chips.

That is, similar to the above-described first embodiment, in this fifth embodiment, such a circuit wafer 200 is prepared on which a plurality of structural members 20a have been formed and testing-purpose pads 21 have been provided with respect to the respective structural members 20a. These structural members 20a will constitute the circuit chips 20.

Thereafter, in the fifth embodiment, as represented in FIG. 6, a tape material 300 is adhered onto a plane of the above-described circuit wafer 200, while the plane of this circuit wafer 200 is located opposite to a junction plane thereof with respect to the sensor chips 10. As this tape material 300, the above-described dicing tape 300 is employed. Thereafter, the circuit wafer 200 is segmented in the unit of the structural member 20a from the opposite side with respect to the dicing tape 300 by a dicing cut manner so as to obtain circuit chips 20.

In connection with the completion of the above-described cutting work, as shown in FIG. 6, an integral material 400 is formed on which the segmented respective circuit chips 20 have been integrally combined with each other by the dicing tape 300. As the tape material 300, any sorts of tapes may be employed if these tapes are capable of supporting the segmented circuit chips 20 in one body and also have applicability with respect to dicing.

Then, as represented in FIG. 6, one planes 11 of the sensor chips 10 are located opposite to the circuit chips 20 in the integral material 400, and the sensor chips 10 are mounted via bumps 30 on the respective circuit chips 20 so as to be brought into a joint condition. In this case, before the sensor chips 10 are mounted, the tape material 300 may be alternatively stretched so as to widen the intervals of the respective circuit chips 20 in the integral material 400.

Similar to the above-explained first embodiment, under this condition, characteristics of the sensor chips 10 are tested via the testing-purpose pads 21. Thereafter, in the fifth embodiment, in the integral material 400, the dicing tape 300 is striped from the circuit chip 20. As a result, also in this fifth embodiment, the acceleration sensors S1 which are shown in FIG. 1A and FIG. 1B and have been formed in the chip shapes can be manufactured.

In accordance with the above-described manufacturing method of the fifth embodiment, the sensor chips 10 are electrically joined to the circuit chips 20 in the integral material 400, resulting in essentially packaging condition. Also, since the sensor chips 10 are combined with each other in one body by the integral material 400, these sensor chips 10 can be handled in a superior handling manner. Furthermore, since the one side 11 of the sensor chips 10 (namely, planes 11 of capacitance changing portions 12 thereof) are directed to the circuit chips 20, alien substances can be hardly entered to spaces formed on the planes of the capacitance changing portions 12.

Then, the characteristics of the sensor chips 10 are tested under this condition. As a result, also in this fifth embodiment, the packaging condition with the superior handling characteristic can be realized during the characteristic testing operation, and moreover, the characteristics of the sensor chips 10 can be tested while avoiding that the alien substances are adhered to the capacitance changing portion 12.

Also, in accordance with the manufacturing method of the fifth embodiment, when the characteristic testing operation is carried out, although the circuit chips 20 are combined with each other in one body by the dicing tape 300, these circuit chips 20 are individually under chip conditions. As a consequence, there is originally no opportunity that a stress is produced due to cambers of the wafer, and thus, such a problem that an adverse influence caused by the stress is given to the characteristic testing operation can be essentially avoided.

It should also be noted that in the fifth embodiment, when the plurality of sensor chips 10 are mounted on the integral material 400, the method for mounting the sensor chips 10 with employment of the tape material described in the above-explained fourth embodiment may be applied.

While the tape material 300 which has been adhered onto the integral material 400 is indicated as a first tape material 300, such a tape material which is adhered to the plural sensor chips 10 is indicated as a second tape material 310 by a broken line in FIG. 6. As to this second tape material 310, any sorts of tapes may be employed if these tapes may be adhered to the sensor chips 10, for example, the above-described dicing tapes may be employed.

In this case, plural pieces of the sensor chips 10 arranged in correspondence with the arrangement of the circuit chip 20 in the integral material 400 are combined with each other in one body by employing the second tape material 310. Then, as shown in FIG. 6, these plural sensor chips 10 combined in one body are joined to the integral material 400. Thereafter, the second tape 310 is stripped, and subsequently, characteristic testing operations as to the sensor chips 10 are carried out in a similar manner to the above-described testing operation.

In this case, in addition to the effects achieved by the above-described fifth embodiment, the individual sensor chips 10 can be mounted on the integral material 400 in a batch manner.

Another Embodiment

Figure 7:
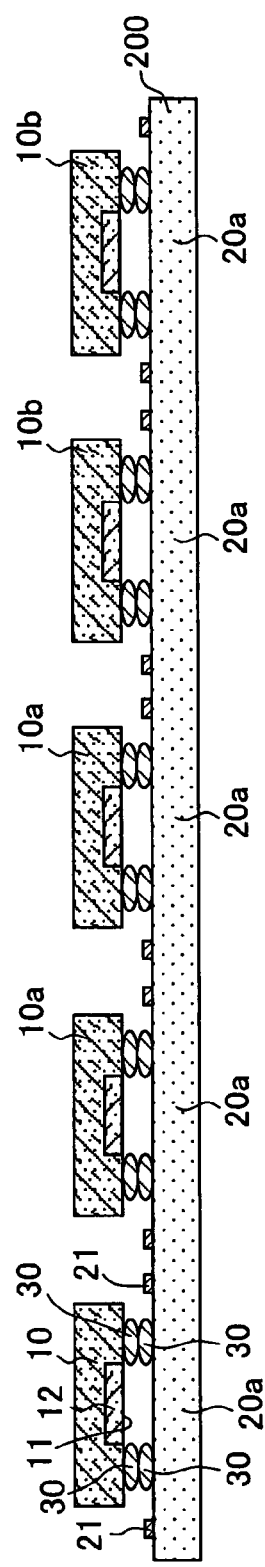
FIG. 7 is a cross sectional view explaining a method for manufacturing a capacitive semiconductor sensor from a wafer according to another embodiment.

FIG. 7 is a step diagram for indicating a manufacturing method of an acceleration sensor in a sectional view manner, according to another embodiment. In each of the above-described embodiments, as the plurality of sensor chips 10 which are mounted and joined with respect to one circuit wafer 200 or one integral material 400, the sensor chips 10 may be formed from other sorts of chips.

As indicated in FIG. 7, two different sorts, or more different sorts of sensor chips 10, 10a, 10b may be joined with respect to a single circuit wafer 200. In this case, as these different sorts of sensor chips, for example, acceleration sensor chips having different detecting sensitivities as to acceleration may be conceived.

Although not shown in the drawings, similar to the above-described case of the circuit wafer 200 shown in FIG. 7, the different sorts of sensor chips 10, 10a, 10b may be joined with respect to a single integral material 400. As previously described, when two different sorts, or more different sorts of these sensor chips 10, 10a, 10b are mounted and joined with respect to the single circuit wafer 200, or the single integral material 400, characteristic testing operations for the different sorts of sensor chips with each other may be carried out in a higher efficiency.

It should also be noted that as to combinations of the respective embodiments, the above-explained respective embodiments may be alternatively combined with each other within a possible combination range other than the above-described combination range.

Also, as the semiconductor capacitance type sensor, this sensor is not limited only to the above-described acceleration sensors, but may be realized by any types of sensors if these sensors are equipped with sensor chips made of semiconductors and having capacitance changing operations on one plane side thereof; and circuit chips for detecting capacitance changes of the sensor chips; and the one plane sides of the sensor chips are electrically connected via bumps to the circuit chips, while the one plane sides are located opposite to the circuit chips, namely, a so-called sensor in which sensor chips are joined by a flip-chip manner under face down condition. Alternatively, for instance, an angular velocity sensor and the like may be employed as the semiconductor capacitance type sensor of the invention.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a capacitive semiconductor sensor comprising:
   forming a plurality of circuit chips in a wafer, wherein each circuit chip includes a pad for testing a sensor chip;
   bonding the sensor chip on each circuit chip with a bump so that the sensor chip is electrically coupled with the circuit chip, wherein each sensor chip is made of semiconductor and has a capacitance changing portion, which is disposed on one side of the sensor chip and has a variable capacitance, wherein the circuit chip detects a capacitance change of the sensor chip, and wherein the one side of the sensor chip faces the circuit chip;
   testing each sensor chip through the pad; and
   cutting the wafer into individual circuit chips so that the circuit chip and the sensor chip provide the capacitive semiconductor sensor.

2. The method according to claim 1, further comprising:
   testing each circuit chip in the wafer before the bonding, wherein
   in the bonding, the sensor chip is bonded on the circuit chip, which is defined as a non-defective product in the testing each circuit chip.

3. The method according to claim 1, further comprising:
   forming a notch along with a cutting line on the wafer before the bonding.

4. The method according to claim 1, further comprising:
   bonding the sensor chips on a dicing tape in such a manner that arrangement of the sensor chips corresponds to arrangement of the circuit chips in the wafer before the bonding; and removing the dicing tape from the sensor chips after the bonding.

5. The method according to claim 1, wherein the sensor chips includes a plurality of different types of sensor chips.

6. The method according to claim 1, wherein each circuit chip is capable of converting the capacitance change of the sensor chip to a voltage signal, and the voltage signal is outputted from the pad of each circuit chip.

7. The method according to claim 1, wherein the bump is made of gold or solder.

8. A method for manufacturing a capacitive semiconductor sensor comprising:
   forming a plurality of circuit chips in a wafer, wherein each circuit chip includes a pad for testing a sensor chip;
   bonding the wafer on a first dicing tape;
   cutting the wafer into individual circuit chips;
   bonding the sensor chip on each circuit chip with a bump so that the sensor chip is electrically coupled with the circuit chip, wherein each sensor chip is made of semiconductor and has a capacitance changing portion, which is disposed on one side of the sensor chip and has a variable capacitance, wherein the circuit chip detects a capacitance change of the sensor chip, and wherein the one side of the sensor chip faces the circuit chip;
   testing each sensor chip through the pad; and
   removing the first dicing tape from the circuit chips after the bonding so that the circuit chip and the sensor chip provide the capacitive semiconductor sensor.

9. The method according to claim 8, further comprising:
   bonding the sensor chips on a second dicing tape in such a manner that arrangement of the sensor chips corresponds to arrangement of the circuit chips in the wafer before the bonding; and
   removing the second dicing tape from the sensor chips after the bonding.

10. The method according to claim 8, wherein the sensor chips includes a plurality of different types of sensor chips.

11. The method according to claim 8, wherein each circuit chip is capable of converting the capacitance change of the sensor chip to a voltage signal, and the voltage signal is outputted from the pad of each circuit chip.

12. The method according to claim 8, wherein the bump is made of gold or solder.

\* \* \* \* \*